United States Patent
Tsujino et al.

(10) Patent No.: US 11,264,235 B2
(45) Date of Patent: *Mar. 1, 2022

(54) ACTIVE MATRIX SUBSTRATE, MICROFLUIDIC DEVICE PROVIDED WITH SAME, METHOD FOR PRODUCING SAID ACTIVE MATRIX SUBSTRATE, AND METHOD FOR PRODUCING SAID MICROFLUIDIC DEVICE

(71) Applicant: Sharp Kabushiki Kaisha, Sakai (JP)

(72) Inventors: Kazuya Tsujino, Sakai (JP); Tomoko Teranishi, Sakai (JP); Atsushi Hachiya, Sakai (JP); Hiroaki Furukawa, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 40 days.

This patent is subject to a terminal disclaimer.

(21) Appl. No.: 16/636,018

(22) PCT Filed: Jul. 27, 2018

(86) PCT No.: PCT/JP2018/028334
§ 371 (c)(1),
(2) Date: Feb. 2, 2020

(87) PCT Pub. No.: WO2019/026812
PCT Pub. Date: Feb. 7, 2019

(65) Prior Publication Data
US 2021/0134585 A1    May 6, 2021

(30) Foreign Application Priority Data
Aug. 3, 2017   (JP) .............................. JP2017-150996

(51) Int. Cl.
H01L 21/02    (2006.01)
H01L 29/786   (2006.01)
B01L 3/00     (2006.01)

(52) U.S. Cl.
CPC .... H01L 21/0217 (2013.01); B01L 3/502715 (2013.01); B01L 3/502792 (2013.01);
(Continued)

(58) Field of Classification Search
None
See application file for complete search history.

(56) References Cited

U.S. PATENT DOCUMENTS

2010/0053717 A1    3/2010  Takahashi
2020/0078790 A1*   3/2020  Tachino ........... B01L 3/502792
(Continued)

FOREIGN PATENT DOCUMENTS

WO    2008/084822 A1    7/2008

*Primary Examiner* — Alexander G Ghyka
(74) *Attorney, Agent, or Firm* — ScienBiziP, P.C.

(57) ABSTRACT

Provided are an active matrix substrate having a reduced driving voltage and excellent adhesion between a dielectric layer and a water-repellent layer and a microfluidic device including the substrate. The active matrix substrate includes an array electrode, a dielectric layer covering the array electrode, and a first water-repellent layer in this order on a first substrate. The dielectric layer includes a silicon nitride film located on the side in contact with the first water-repellent layer, and the silicon nitride film has a surface layer region containing oxygen in the surface on the side in contact with the first water-repellent layer.

8 Claims, 5 Drawing Sheets

(52) U.S. Cl.
CPC .... *H01L 21/0212* (2013.01); *H01L 29/78603* (2013.01); *B01L 2300/0819* (2013.01); *B01L 2400/0427* (2013.01)

(56) References Cited

U.S. PATENT DOCUMENTS

2020/0219905 A1* 7/2020 Yamazaki ........... H01L 27/0883
2020/0312889 A1* 10/2020 Hachiya ............. H01L 27/1244

* cited by examiner

ACTIVE MATRIX SUBSTRATE, MICROFLUIDIC DEVICE PROVIDED WITH SAME, METHOD FOR PRODUCING SAID ACTIVE MATRIX SUBSTRATE, AND METHOD FOR PRODUCING SAID MICROFLUIDIC DEVICE

TECHNICAL FIELD

One aspect of the present invention relates to an active matrix substrate, a microfluidic device including the same, and methods for producing them.

BACKGROUND ART

In the fields such as microfluidic engineering, for example, manipulation and precise control of a small volume, such as submicroliter, of fluid are required. Accordingly, electro wetting (EW) that manipulates a droplet by means of application of an electric field has been paid attention to.

Electrowetting is a phenomenon in which when a voltage is applied to a droplet placed on a water-repellent layer disposed on a dielectric layer covering an electrode, the surface energy of the dielectric layer changes by the electrostatic energy of the capacitor formed between the electrode and the droplet, resulting in a change of the solid-liquid interface energy to change the contact angle of the droplet with the surface of the water-repellent layer.

In recent years, development of microfluidic devices (also referred to as electrowetting device or droplet device) using such electrowetting is in progress.

Among the microfluidic devices, for example, in an active matrix electrowetting on dielectric (AM-EWOD) device using, for example, a thin-film transistor (TFT), an active matrix substrate and a counter substrate each having a water-repellent layer are bonded to each other with a gap therebetween via a sealing material such that the water-repellent layers face each other, and a droplet is stored in the gap. Thin-film electronic circuits (active elements), such as TFTs, constituting the active matrix substrate are configured for selectively applying a driving voltage to electrodes.

For example, PTL 1 describes a liquid device, which is an example of a microfluidic device, to be applied to, for example, an image display apparatus.

In this liquid device, in order to supplement the insulation strength, an insulating film made by firing and vitrifying a silica-based inorganic coating film, such as spin-on-glass (SOG), is disposed between an electrode and a water-repellent layer.

CITATION LIST

Patent Literature

PTL 1: International Publication No. WO2008/084822

SUMMARY OF INVENTION

Technical Problem

However, when an SOG-derived insulating film is applied to an AM-EWOD device including a TFT, there is a problem that the firing process at about 300° C. for vitrification of SOG affects the TFT characteristics.

To this problem, a dielectric layer made of a silicon nitride (SiNx) film produced by a plasma chemical vapor deposition (plasma CVD) method can be used instead of the SOG-derived insulating film. Since a silicon nitride film formed by a plasma CVD method does not affect the TFT characteristics and has a high dielectric constant, the driving voltage of electrowetting can be decreased.

However, this silicon nitride film may have insufficient adhesion with a fluororesin forming a water-repellent layer to cause interlayer peeling during the manufacturing process or cause problems in water repellency and leak resistance.

In contrast, when a silicon oxide (SiOx) film is used instead of the silicon nitride film as the dielectric layer, although the adhesion with the fluororesin is improved, since the dielectric constant is low, it has a problem of increasing the voltage necessary for driving the electrowetting.

The present invention has been made in view of the above problems, and the object is to provide an active matrix substrate having a reduced driving voltage and excellent adhesion between a dielectric layer and a water-repellent layer and a microfluidic device including the active matrix substrate.

Solution to Problem

In order to solve the above-mentioned problems, a method for manufacturing an active matrix substrate according to an aspect of the present invention includes a step of forming a first electrode on a first substrate, a step of forming a dielectric layer covering the first electrode, and a step of forming a first water-repellent layer on the dielectric layer. The step of forming a dielectric layer includes a step of forming a silicon nitride film by a plasma chemical vapor deposition method and a step of oxidizing the surface of the silicon nitride film; and the step of forming a first water-repellent layer includes a step of forming the first water-repellent layer on the surface of the oxidized silicon nitride film.

In addition, a method for manufacturing a microfluidic device according to an aspect of the present invention includes the steps included in the method for manufacturing an active matrix substrate; a step of forming a counter substrate including a step of forming a second electrode on a second substrate and a step of forming a second water-repellent layer on the second electrode; and a step of bonding the active matrix substrate and the counter substrate with a gap therebetween via a sealing material such that the first water-repellent layer and the second water-repellent layer face each other.

In addition, an active matrix substrate according to an aspect of the present invention includes a first electrode, a dielectric layer covering the first electrode, and a first water-repellent layer in this order on a first substrate. The dielectric layer includes a silicon nitride film located on the side in contact with the first water-repellent layer, and the silicon nitride film has a surface layer region containing oxygen in the surface on the side in contact with the first water-repellent layer.

In addition, a microfluidic device according to an aspect of the present invention the active matrix substrate and a counter substrate including a second electrode and a second water-repellent layer in this order on a second substrate. The active matrix substrate and the counter substrate are bonded to each other with a gap therebetween via a sealing material such that the first water-repellent layer and the second water-repellent layer face each other.

Advantageous Effects of Invention

According to an aspect of the present invention, it is possible to provide an active matrix substrate having a reduced driving voltage and excellent adhesion between the dielectric layer and the water-repellent layer and a microfluidic device including the active matrix substrate.

DESCRIPTION OF EMBODIMENTS

Figure 1:
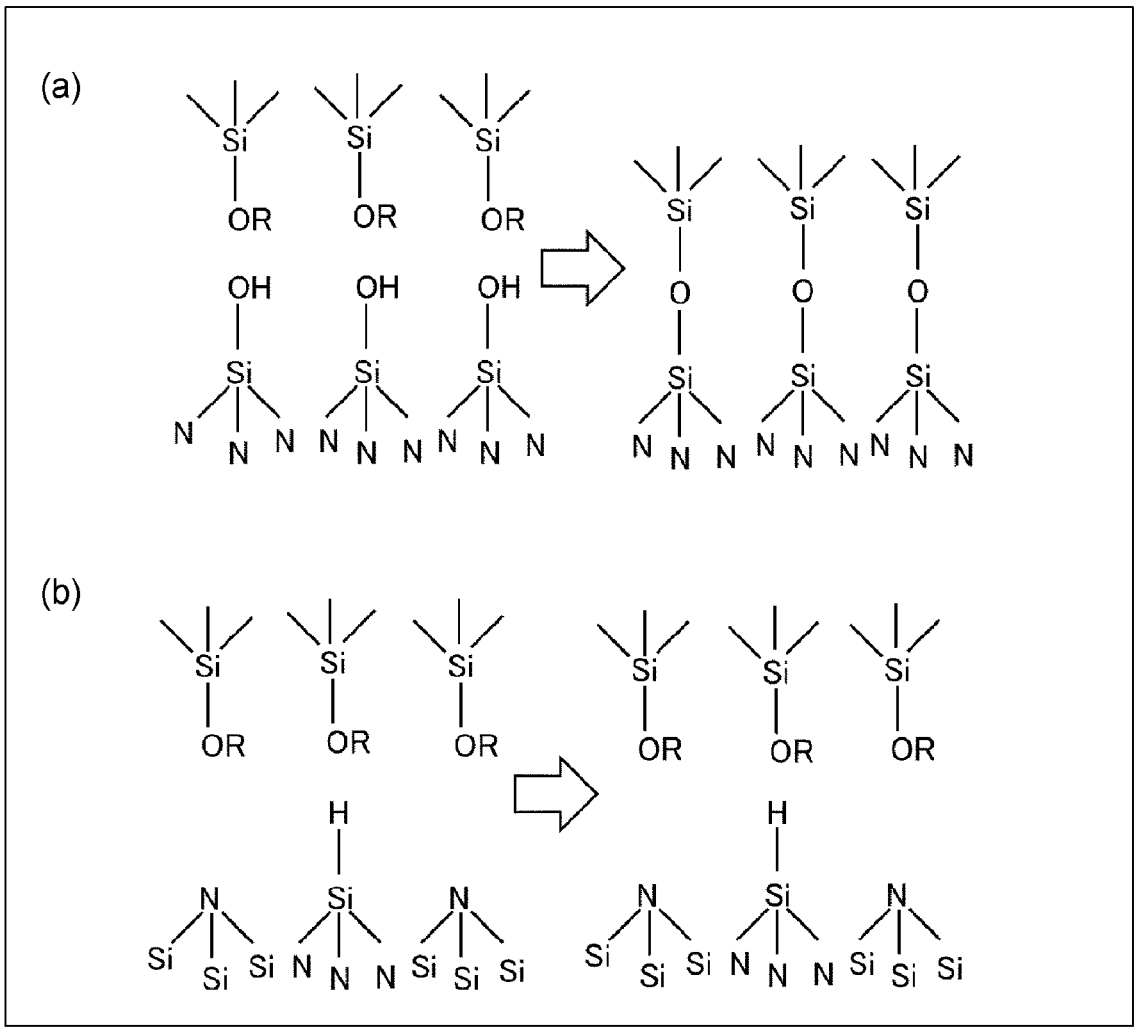
FIG. 1 includes a schematic diagram (a) illustrating the state of bonding between an oxidized dielectric layer surface and a water-repellent layer surface; and a schematic diagram (b) illustrating the state between a dielectric layer surface and a water-repellent layer surface before oxidation.

Embodiments of the present invention will now be described in detail. Incidentally, for convenience of explanation, members having the same functions as those described in each embodiment will be given the same reference numerals and explanation thereof will be omitted.

Embodiment 1

In the present embodiment, as an example of the microfluidic device according to the present invention, an active matrix electrowetting on dielectric (AM-EWOD) device that performs droplet driving by using a thin-film transistor (TFT) in an active matrix array (electrowetting on dielectric (EWOD)) will be described.

An embodiment of the present invention will be described as follows based on FIGS. 1 to 3.

FIG. 1 includes a schematic diagram (a) illustrating the state of bonding between an oxidized dielectric layer surface and a water-repellent layer surface; and a schematic diagram (b) illustrating the state between a dielectric layer surface and a water-repellent layer surface before oxidation. FIG. 2 is a diagram illustrating an AM-EWOD device of Embodiment 1 of the present invention. FIG. 3 is a diagram illustrating a cross section of the AM-EWOD device of Embodiment 1 of the present invention.

Figure 2:
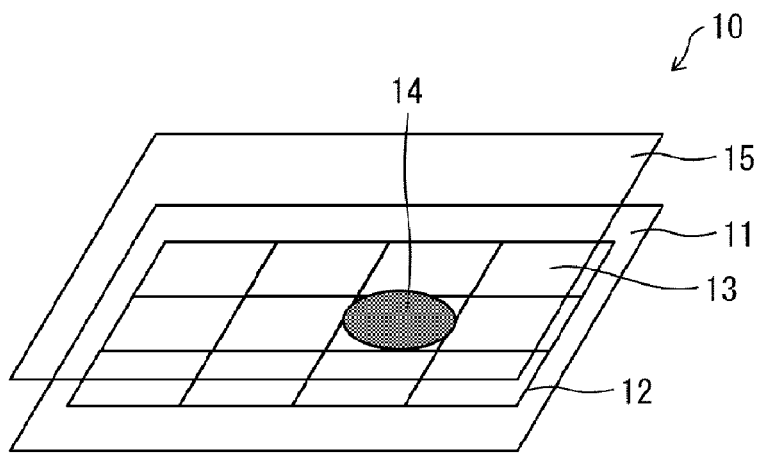
FIG. 2 is a diagram illustrating an AM-EWOD device of Embodiment 1 of the present invention.
Figure 3:
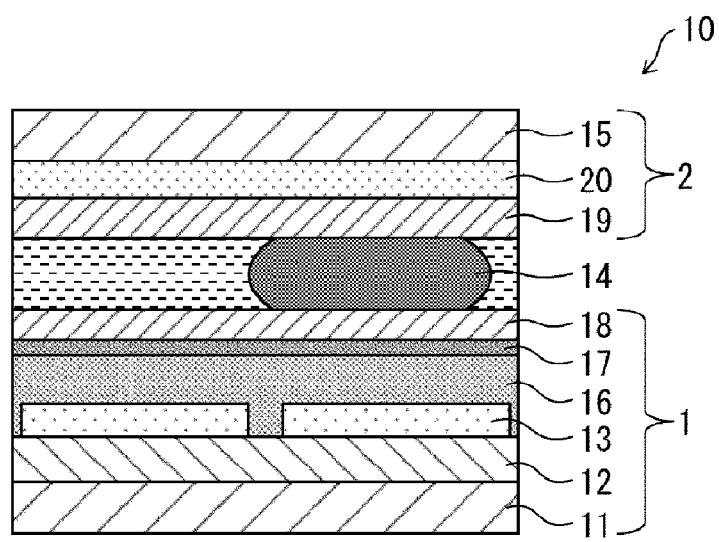
FIG. 3 is a diagram illustrating a cross section of the AM-EWOD device of Embodiment 1 of the present invention.

As shown in FIGS. 2 and 3, the AM-EWOD device 10 according to the present embodiment includes an active matrix substrate 1 including a first substrate 11, a counter substrate 2 including a second substrate 15, and one or more droplets 14 enclosed in the gap therebetween.

In the active matrix substrate 1, a thin-film electronic circuit 12 is disposed on the first substrate 11, and a plurality of drivable array electrodes (first electrodes) 13 is disposed on the thin-film electronic circuit 12. The first substrate 11 is, for example, a glass substrate, and the thin-film electronic circuit 12 is, for example, a thin-film transistor. The thin-film electronic circuit 12 is configured such that an appropriate driving voltage can be selectively applied to an array electrode (first electrode) 13 based on a control signal from an external driving circuit (not shown). The droplet 14 to be driven by EWOD is trapped between the active matrix substrate 1 and the counter substrate 2. The droplet 14 may be a single droplet or a plurality of droplets.

As shown in FIG. 3, in the AM-EWOD device 10 according to the present embodiment, a silicon nitride film is disposed on the thin-film electronic circuit 12 on the first substrate 11 and the array electrodes (first electrodes) 13 as a dielectric layer 16 covering them. In the device, the surface of the silicon nitride film (i.e., the surface on the side in contact with the water-repellent layer) is oxidized to form a surface layer region 17 doped with oxygen (O) on the surface of the silicon nitride film made of nitrogen (N), silicon (Si), hydrogen (H), etc. and in the vicinity thereof. A first water-repellent layer 18 is disposed on the surface layer region 17 containing oxygen. The water repellency of the water-repellent layer changes by the voltage applied to the array electrode (first electrode) 13 and is controlled to enhance the movement of the droplet 14.

The array electrode (first electrode) 13 is, for example, a transparent oxide electrode of ITO (indium tin oxide), IZO (indium zinc oxide), ZnO (zinc oxide), or the like or a metal electrode of titanium (Ti), aluminum (Al), or the like, and is divided and disposed according to the pattern of the thin-film electronic circuit 12.

The silicon nitride film constituting the dielectric layer 16 is disposed to protect the thin-film electronic circuit 12 and the array electrodes (first electrodes) 13 and to secure insulation between these components and the droplet 14. The silicon nitride film is suitably formed by a plasma CVD method using source gases including, for example, a nitrogen-containing gas (e.g., $N_2$ gas and $NH_3$ gas) and a $SiH_4$ gas. That is, it is possible to form a dielectric layer being compact and showing a high dielectric constant, in a plasma CVD apparatus, by chemical vapor deposition growth of a silicon nitride film while supplying source gases. The composition ratio of silicon nitride (SiNx) can be appropriately selected by a person skilled in the art by adjusting the flow ratios of the source gases according to desired insulation, dielectric constant, and so on. In the AM-EWOD device 10 according to the present embodiment, the thickness of the dielectric layer made of a silicon nitride film is, for example, 100 to 400 nm.

The silicon nitride film contains nitrogen (N), silicon (Si), and optionally hydrogen (H), and on the surface thereof, there is little exposure of functional groups having reactivity as shown in the schematic diagram (b) of FIG. 1. Accordingly, if a water-repellent layer is stacked on such a silicon nitride film without performing surface treatment, a bond with a reactive functional group exposing to the surface of the water-repellent layer is not formed, and sufficient adhesion is hardly obtained.

In contrast, as shown in the schematic diagram (a) of FIG. 1, a surface layer region having a locally high oxygen concentration is formed by oxidizing and doping the surface of the silicon nitride film with oxygen, and as a result, a reactive functional group, such as a hydroxyl group bonded to silicon on the silicon nitride film surface (Si—OH), is generated. Accordingly, when a water-repellent layer is stacked on the silicon nitride film having the oxidized surface, the reactive functional group, such as Si—OH, on the silicon nitride film and the reactive functional group (e.g., Si—OR group) of the water-repellent layer surface react to each other to form a Si—O—Si bond and show high adhesion.

The method for oxidizing the surface of the silicon nitride film is not particularly limited, and, for example, 02 plasma treatment, ultraviolet treatment, treatment with an oxidizing liquid such as an ozone liquid, or annealing treatment can be used. Here, the annealing treatment is a method of performing, for example, heat treatment at 100° C. to 250° C. in air or oxygen atmosphere.

Regarding the surface layer region having a locally high oxygen concentration formed on the surface of the silicon nitride film and in the vicinity thereof by oxidation, the oxygen content in the surface layer region may be constant in the depth direction or may have a concentration gradient such that the concentration decreases from the surface on the side in contact with the water-repellent layer toward the surface on the side in contact with the first electrode.

In addition, in order to maintain a high dielectric constant of the silicon nitride film, the thickness of the surface layer region is preferably within a range of 10%, more preferably 5%, of the thickness of the dielectric layer. If the silicon nitride film is doped with oxygen into the deep inside exceeding a range of 10% of the thickness of the dielectric layer, the dielectric constant of the silicon nitride film may decrease. More preferably, the oxygen concentration at a position deeper than 10% of the thickness of the dielectric layer in the depth direction from the surface of the silicon nitride film is preferably 2 atm % or less, more preferably 1 atm % or less. Incidentally, the oxygen concentrations on the surface and the inside of the silicon nitride film and the depth from the surface can be measured by XPS depth profile analysis which sequentially performing surface composition analysis while exposing the inside of the film by a combination of X-ray photoelectron spectroscopic measurement and rare gas ion sputtering.

In addition, in order to improve the adhesion with the water-repellent layer uniformly over the whole surface of the silicon nitride film, the thickness of the surface layer region is preferably 1 nm or more, more preferably 2 nm or more.

In order to form a reactive functional group (Si—OH) in an amount sufficient for securing adhesion with the water-repellent layer, the oxygen concentration on the surface of the silicon nitride film on the side in contact with the water-repellent layer is preferably 5 atm % or more, more preferably within a range of 10 to 20 atm %.

The first water-repellent layer 18 can be formed by forming a film having a thickness of about 30 to 100 nm from a water repellent material by a common film-forming method, such as dip coating, slit coating, or printing, and as needed performing patterning by dry photoetching. In the patterning of the first water-repellent layer 18, a lift-off method, in which a resist is patterned by photolithography, a water repellent material is then formed into a film, and the water-repellent layer is removed together with the resist, may be used. As the water repellent material, a fluororesin having high water repellency can be used. For example, a fluororesin having a side chain including a functional group that can form a Si—O—Si bond through a reaction with a reactive functional group (Si—OH) formed on the silicon nitride film surface can be suitably used. Examples of the functional group include —Si—OR, —NH—Si—OR, —CO—NH—Si—OR, and —COOH. Specifically, for example, Cytop (registered trademark) can be used.

In the AM-EWOD device 10 according to the present embodiment, a second electrode 20 is disposed on a second substrate 15. The second electrode is, for example, a transparent oxide electrode of ITO (indium tin oxide), IZO (indium zinc oxide), ZnO (zinc oxide), or the like or a metal electrode of titanium (Ti), aluminum (Al), or the like. In addition, a second water-repellent layer 19 is disposed on and covers the second electrode 20. The second water-repellent layer 19 can be formed as in the first water-repellent layer by forming a film having a thickness of about 30 to 100 nm from a fluororesin having high water repellency by a common film-forming method, such as dip coating, slit coating, or printing. In addition, the second substrate may be provided with a hole (not shown) as an inlet for the droplet 14 of a reagent.

The AM-EWOD device according to the present embodiment includes, as a dielectric layer, a silicon nitride film having a surface layer region having a high oxygen concentration in the vicinity of the surface on the side in contact with the water-repellent layer and consequently has excellent adhesion between the water-repellent layer and the dielectric layer. Accordingly, it is possible to prevent a problem of peeling of the water-repellent layer during the manufacturing process and manufacture the AM-EWOD device in a high yield.

Embodiment 2

Another embodiment of the present invention will now be described based on FIGS. 4 and 5.

Figure 4:
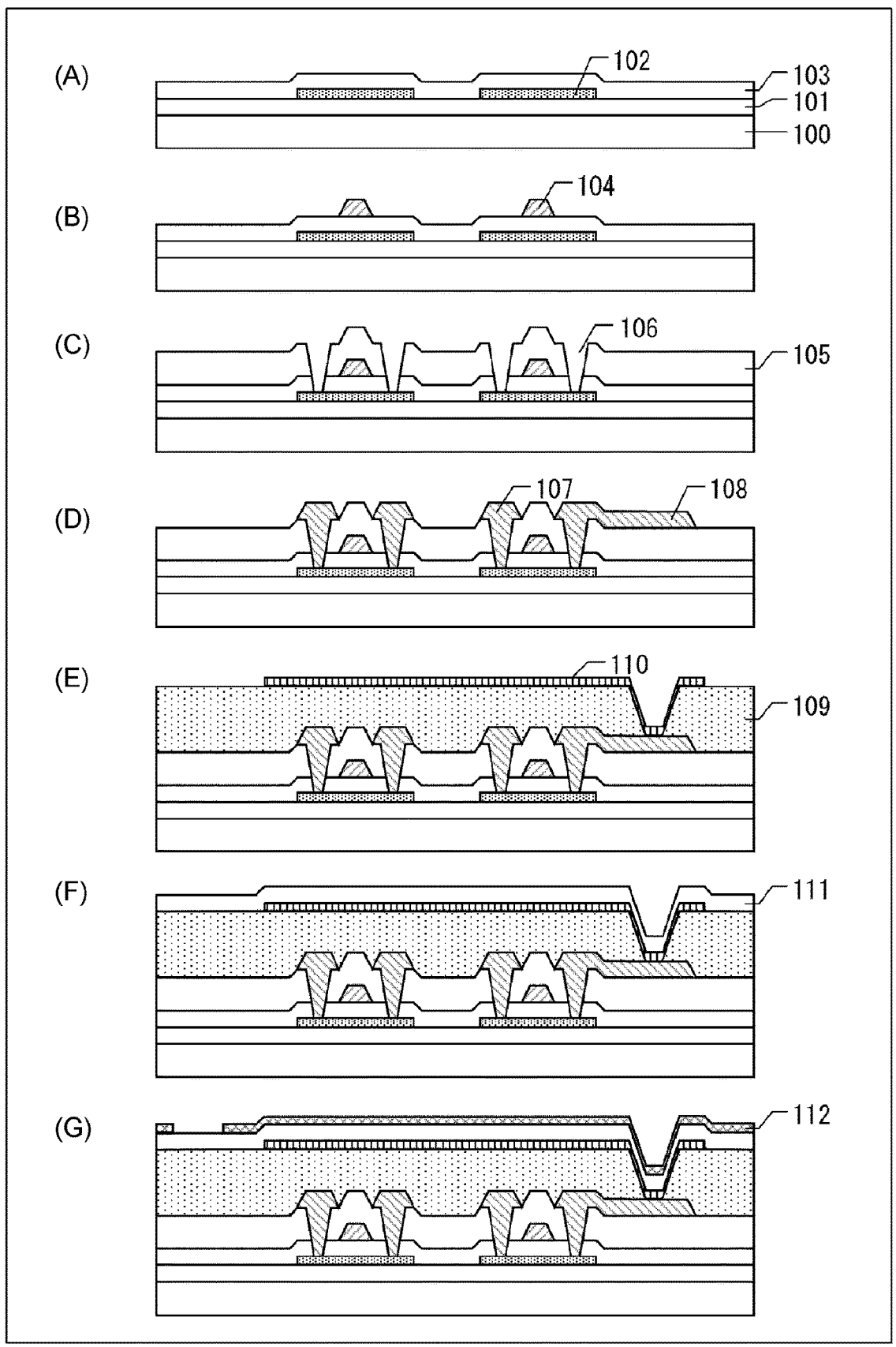
FIG. 4 shows a method for manufacturing an active matrix substrate of Embodiment 2 of the present invention.

FIG. 4 shows a method for manufacturing an active matrix substrate of the present embodiment. FIG. 5 shows a method for manufacturing a counter substrate of the present embodiment.

First, as shown in (A) of FIG. 4, a buffer layer 101 is formed on a glass substrate (first substrate) 100. The buffer layer 101 may be a film having a thickness of about 100 to 300 nm formed from $SiN_x$, $SiO_2$, SiNO, or the like. The buffer layer may have a single layer structure or a multilayer structure formed by stacking two or more films or may not be present depending on the device. A semiconductor layer 102 is formed on the buffer layer 101. The semiconductor layer 102 is a Si film having a thickness of about 20 to 100 nm and may be patterned by dry photoetching after film formation and crystallization. Furthermore, on the buffer layer 101 and the semiconductor layer 102, a film of $SiN_x$, $SiO_2$, or the like or a layered film of $SiN_x/SiO_2$ or the like is formed at a thickness of about 50 to 200 nm as a gate insulating layer 103. Furthermore, the Si film may be doped with an n-type or p-type impurity. Furthermore, as the semiconductor layer 102, an oxide semiconductor may be used.

Subsequently, as shown in (B) of FIG. 4, gate electrodes 104 are formed. The gate electrodes 104 may be prepared by forming a film from a metal material, such as W, Mo, or Al, at a thickness of 100 to 400 nm and then patterning the film by dry photoetching. In order to improve the adhesion and the contact resistance, a layered structure such as W/Ta, MoW, Ti/Al, Ti/Al/Ti, or Al/Ti or an alloy material of these metals may be appropriately employed as the gate electrode 104.

Subsequently, as shown in (C) of FIG. 4, as an interlayer insulating layer 105, a film of $SiN_x$, $SiO_2$, SiNO, or a layered structure thereof is formed at a thickness of about 500 to 900 nm. The interlayer insulating layer 105 and the gate insulating layer 103 are then etched by dry photoetching to form a contact hole 106 on the semiconductor layer 102.

Subsequently, a film having a thickness of 200 to 400 nm is formed from a metal material, such as Al or Mo, and is then patterned by dry photoetching to form a source electrode 107 and a drain electrode 108 on the interlayer insulating layer 105 and in the contact hole 106 as shown in (D) of FIG. 4. In order to improve the adhesion and the contact resistance, as the source electrode 107 and the drain electrode 108, a layered structure of metal materials or an alloy material may be appropriately employed. As the metal materials, for example, Ti/Al, Ti/Al/Ti, Al/Ti, TiN/Al/TiN, Mo/Al, Mo/Al/Mo, Mo/AlNd/Mo, or MoN/Al/MoN may be appropriately employed.

Subsequently, as shown in (E) of FIG. 4, an interlayer insulating layer 109 is formed on the interlayer insulating layer 105, the source electrode 107, and the drain electrode 108. The interlayer insulating layer 109 may be prepared by forming a film from a photosensitive organic material by photolithography and patterning it. An array electrode (first electrode) 110 that is in partial contact with the drain electrode 108 is formed on the interlayer insulating layer 109. The array electrode 110 may be prepared by forming a film from an electrode material, such as ITO, IZO, or ZnO, at a thickness of about 50 to 150 nm on the drain electrode 108 and the interlayer insulating layer 109 and patterning the film by wet photoetching. After patterning of the array electrode 110, in order to reduce the resistance of the array electrode 110, the array electrode 110 may be subjected to annealing treatment.

Subsequently, as shown in (F) of FIG. 4, a dielectric layer 111 is formed on the interlayer insulating layer 109 and the array electrode 110. The dielectric layer 111 has a role of protecting the underlayers of the active matrix substrate and a role of securing insulation between the droplet and the active matrix substrate during the use of the EWOD device.

The dielectric layer 111 is prepared by forming a silicon nitride ($SiN_x$) film having a thickness of about 100 to 400 nm by a plasma CVD method, as in the prior embodiment, and then forming a surface layer region having a high oxygen concentration by oxidizing the surface. The oxidation method is not particularly limited as long as a region having a higher oxygen concentration than that of the inside is formed in the vicinity of the surface of the silicon nitride film, and, for example, $O_2$ plasma treatment, ultraviolet treatment, treatment with an oxidizing liquid such as an ozone liquid, or annealing treatment can be used. The configurations, such as the thickness of the surface layer region having a high oxygen concentration, the oxygen concentrations in the inside and outside of the surface layer region, and the oxygen concentration of the silicon nitride film surface, are the same as those described in the prior embodiment. Although not shown in FIG. 4, in order to remove the dielectric layer 111 at the mounting terminal of the active matrix substrate, patterning may be performed by dry photoetching.

Finally, as shown in (G) of FIG. 4, a first water-repellent layer 112 is formed on the dielectric layer 111. The first water-repellent layer 112 may be prepared by forming a film from a water repellent material at a thickness of about 30 to 100 nm by a film-forming method, such as dip coating, slit coating, or printing, and performing patterning by dry photoetching. In the patterning of the first water-repellent layer 112, a lift-off method, in which a resist is patterned by photolithography, a water repellent material is then formed into a film, and the first water-repellent layer is removed together with the resist, may be used. As the water repellent material, a fluororesin having high water repellency can be used. For example, a fluororesin having a side chain including a functional group that can form a Si—O—Si bond through a reaction with a reactive functional group (Si—OH) formed on the silicon nitride film surface can be suitably used. Examples of the functional group include —Si—OR, —NH—Si—OR, —CO—NH—Si—OR, and —COOH. Specifically, for example, Cytop (registered trademark) can be used.

By the above steps, an active matrix substrate is obtained. Incidentally, in FIG. 4, although a method for manufacturing a TFT circuit in an array element of the active matrix substrate, peripheral circuits, such as a gate driver and a source driver, may be simultaneously formed.

Next, a method for manufacturing a counter substrate of a microfluidic device according to the present embodiment and a method for manufacturing the microfluidic device and the structure will be described based on (A) to (D) of FIG. 5.

First, a method for manufacturing a counter substrate will be described. At first, as shown in (A) of FIG. 5, a counter electrode (second electrode) 201 is formed on a glass substrate (second substrate) 200. The counter electrode 201 may be prepared by forming a film from an electrode material, such as ITO, IZO or ZnO, at a thickness of about 50 to 150 nm.

Subsequently, as shown in (B) of FIG. 5, a second water-repellent layer 202 is formed on the counter electrode 201 and is patterned by dry photoetching. The material, thickness, manufacturing method, and patterning method of the second water-repellent layer 202 of the counter substrate may be the same as those of the first water-repellent layer 112 of the active matrix substrate.

Figure 5:
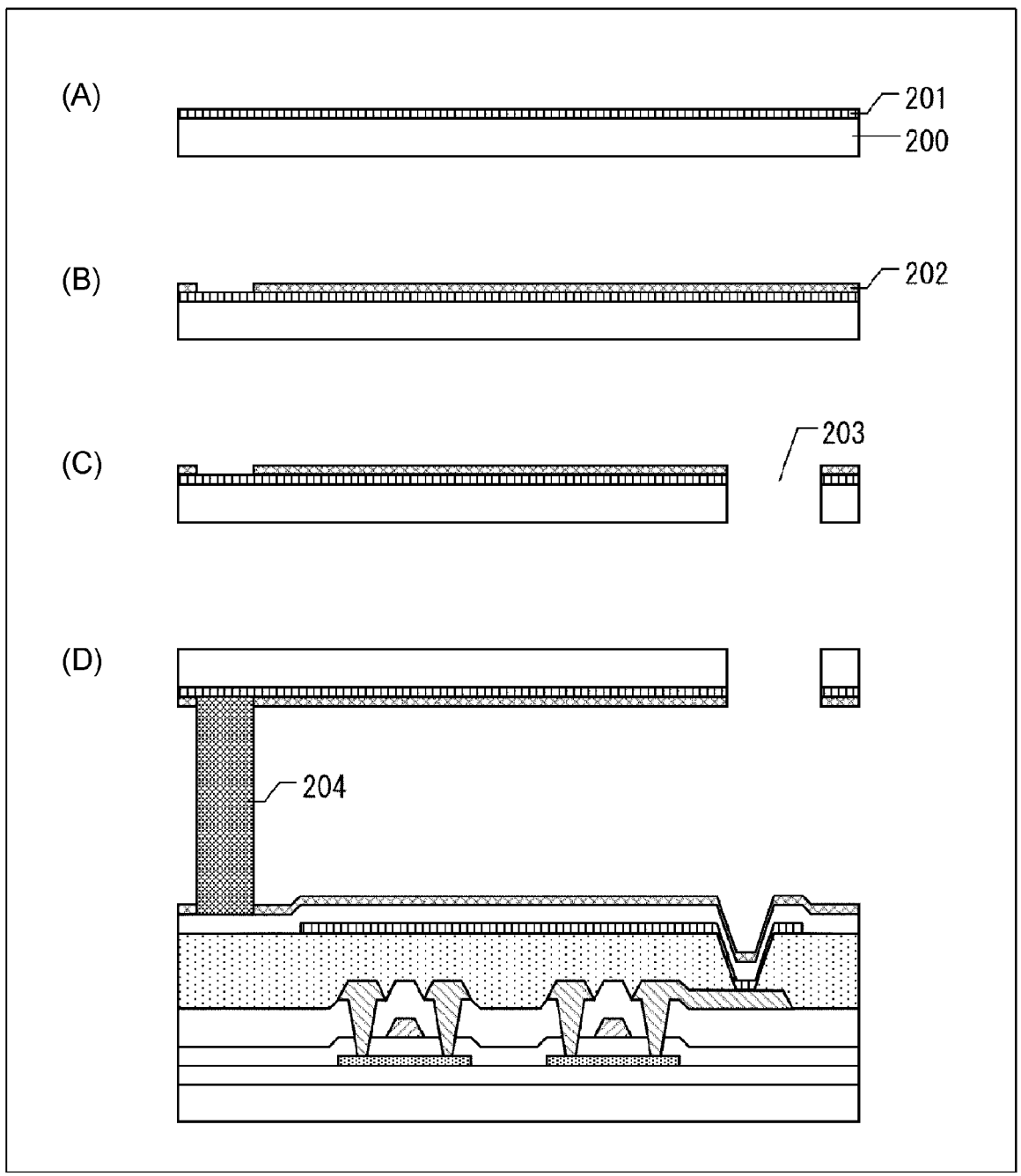
FIG. 5 shows a method for manufacturing a counter substrate of Embodiment 2 of the present invention.

Finally, as shown in (C) of FIG. 5, a reagent inlet 203 is formed in the glass substrate 200, the counter electrode 201, and the second water-repellent layer 202. The reagent inlet 203 is a hole for injecting a reagent and oil to be actually controlled during the use of the microfluidic device and for concurrently degassing the space into which the reagent and oil are injected. The reagent inlet 203 may be formed by machining such as drilling or various glass processing technologies such as wet etching or laser processing. The hole diameter of the reagent inlet 203 is about 1 to 5 mm, and a suitable size may be selected according to the system for injecting a reagent and oil and the injection amounts.

By the above steps, a counter substrate is prepared. Incidentally, in (C) of FIG. 5, although an example of forming one reagent inlet 203 is shown, a plurality of reagent inlets 203 may be formed.

Next, a method for manufacturing the microfluidic device shown in (D) of FIG. 5 will be described.

First, on the active matrix substrate shown in (G) of FIG. 4, a sealing material 204 is drawn using a dispenser on the dielectric layer 111 where the first water-repellent layer 112 is removed by patterning. The sealing material 204 is drawn along the entire circumference of the outer edge of the cell that is divided in a subsequent step.

Then, the counter electrode 201 where the second water-repellent layer 202 is removed by patterning and the sealing material 204 are positioned on the counter substrate shown in (C) of FIG. 5, and the counter electrode 201 and the sealing material 204 are adhered to each other. Consequently, the water-repellent layers respectively disposed on the active matrix substrate and the counter substrate face each other.

On this occasion, in order to secure a cell gap between the active matrix substrate and the counter substrate, for example, plastic beans or glass beads are mixed into the sealing material 204. The diameter of the beads mixed into the sealing material 204 may be 200 to 300 μm considering that a constant amount of a reagent is injected into and actuated.

After bonding, the sealing material 204 is hardened by annealing treatment while applying a force to both the substrates. According to the above, the active matrix substrate and the counter substrate can be bonded to each other while securing a uniform cell gap therebetween. Since the sealing material 204 is disposed on the entire circumference of the outer edge of the cell, it seals between the active matrix substrate and the counter substrate for each cell. Incidentally, a conductive paste for vertical conductive connection for connecting the counter electrode to a mounting terminal may be applied to the counter substrate concurrent with the above-described drawing of the sealing material 204.

The active matrix substrate and the microfluidic device including the substrate according to the present invention include, as a dielectric layer, a silicon nitride film having a surface layer region having a high oxygen concentration in the vicinity of the surface on the side in contact with the water-repellent layer, and thereby the adhesion between the water-repellent layer and the dielectric layer is excellent. Accordingly, it is possible to prevent a problem of peeling of the water-repellent layer during the manufacturing process and manufacture the active matrix substrate and the microfluidic device in high yields.

Embodiment 3

Another Embodiment of the present invention will now be described based on FIG. 6.

Figure 6:
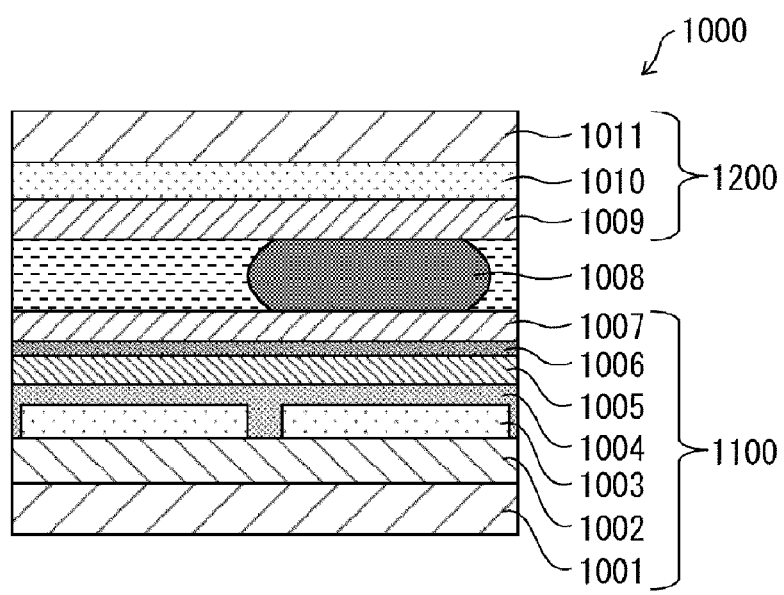
FIG. 6 is a diagram illustrating an AM-EWOD device of Embodiment 3 of the present invention.

FIG. 6 is a diagram illustrating a cross section of an AM-EWOD device 1000 of the present embodiment.

The present embodiment differs from the above Embodiment 1 in that the dielectric layer is a layered film composed of two layers. The dielectric layer may have a multilayer structure composed of two or more layers. The configurations of the first substrate 1001, the thin-film electronic circuit 1002, the array electrode (first electrode) 1003, the first water-repellent layer 1007, the droplet 1008, the second water-repellent layer 1009, the second electrode 1010, and the second substrate 1011 are the same as those in Embodiment 1.

As shown in FIG. 6, the AM-EWOD device 1000 according to the present embodiment includes an active matrix substrate 1100 including a first substrate 1001, a counter substrate 1200 including a second substrate 1011, and one or more droplets 1008 enclosed in the gap therebetween.

In the active matrix substrate 1100, a thin-film electronic circuit 1002 is disposed on a first substrate 1001, and a plurality of drivable array electrodes (first electrodes) 1003 is disposed on the thin-film electronic circuit 1002.

As shown in FIG. 6, in the AM-EWOD device 1000 according to the present embodiment, a silicon nitride ($SiN_x$) film, a silicon oxynitride (SiNO) film, or a silicon oxide (SiO) film is disposed on the thin-film electronic circuit 1002 and the array electrode (first electrode) 1003 on the first substrate 1001 to cover them as a lower dielectric layer 1004. In order to maintain a high dielectric constant, the lower dielectric layer is preferably a silicon nitride film. Subsequently, an upper dielectric layer 1005 is disposed on the lower dielectric layer 1004. The upper dielectric layer 1005 is a silicon nitride film formed by a plasma CVD method. In this device, the surface of the upper dielectric layer 1005 (i.e., the surface on the side in contact with the water-repellent layer) is oxidized to form a surface layer region 1006 doped with oxygen (O) on the surface of the silicon nitride film and in the vicinity thereof. A first water-repellent layer 1007 is disposed on this surface layer region 1006 containing oxygen.

The silicon nitride film constituting the upper dielectric layer 1005 has a role of securing insulation between the droplet and the active matrix substrate during the use of the EWOD device. In contrast, the lower dielectric layer 1004 has a role of protecting the underlayers (the thin-film electronic circuit 1002 and the array electrode 1003) of the active matrix substrate, in addition to securing of insulation.

The silicon nitride film, silicon oxynitride film, and silicon oxide film constituting the dielectric layers 1004, 1005 are suitably formed by a plasma CVD method using source gases including, for example, a nitrogen-containing gas (e.g., $N_2$ gas or $NH_3$ gas) and/or an oxygen gas and a $SiH_4$ gas. For example, it is possible to continuously form films by forming the lower dielectric layer 1004 by a plasma CVD method and then forming the upper dielectric layer 1005 by changing the types and/or the flow ratios of the source gases.

When the lower dielectric layer 1004 and the upper dielectric layer 1005 are both silicon nitride films, it is preferred to the upper and lower dielectric layers preferably differ from each other in the composition ratios (ratios of Si, N, and H), the film hydrogen content, or the film density. In addition, the film hydrogen content of the upper silicon nitride film is preferably lower than that of the lower silicon nitride film. Furthermore, the upper silicon nitride film preferably has a film density higher than that of the lower silicon nitride film.

When the lower dielectric layer 1004 and the upper dielectric layer 1005 have different compositions or film densities, it is possible to reduce the influence by the defects (such as pinholes and cracking) that could occur in a film formed by a plasma CVD method. That is, since the positions where defects occur in the lower dielectric layer and the upper dielectric layer are different from each other, a microfluidic device that is less prone to cause a leak defect is obtained by stacking both the layers.

In the AM-EWOD device according to the present embodiment, the thickness of the entire dielectric layer (i.e., the total thickness of the lower dielectric layer and the upper dielectric layer) is, for example, 100 to 400 nm. When the lower dielectric layer 1004 is a silicon nitride film, the thickness ratio between both the layers is not particularly limited as long as the ratio is within a range in which the films compensate each other for the defects. In contrast, when the lower dielectric layer 1004 is a silicon oxynitride film or a silicon oxide film, the thickness ratio between the lower dielectric layer and the upper dielectric layer is within a range in which the films compensate each other for the defects and a high dielectric constant can be maintained. Specifically, the thickness of the upper dielectric layer 1005 of a silicon nitride film is preferably at least 50% or more, more preferably 70% to 90%, of the thickness of the entire dielectric layer.

The method for oxidizing the silicon nitride film constituting the upper dielectric layer 1005 and the thickness and oxygen concentration of the resulting surface layer region 1006 are the same as those described in Embodiment 1.

The AM-EWOD device according to the present embodiment includes, as a dielectric layer, a silicon nitride film having a surface layer region having a high oxygen concentration in the vicinity of the surface on the side in contact with the water-repellent layer and thereby has excellent adhesion between the water-repellent layer and the dielectric layer. Accordingly, it is possible to prevent a problem of peeling of the water-repellent layer during the manufacturing process and to manufacture the AM-EWOD device in a high yield. In addition, since the dielectric layer has a two-layer structure and is thereby less prone to be influenced by defects in the films, a leak defect hardly occurs.

Incidentally, the dielectric layer may have a multilayer structure composed of three or more layers. In such a case, the dielectric layer may include a lower dielectric layer located on the first electrode side, an upper dielectric layer located on the first water-repellent layer side, and an intermediate dielectric layer located therebetween. Here, the lower dielectric layer and the intermediate dielectric layer may be each a silicon nitride film, a silicon oxynitride film, or a silicon oxide film, and the upper dielectric layer is a silicon nitride film and has a surface layer region having a high oxygen concentration in the vicinity of the surface on the first water-repellent layer side. When the dielectric layer has a multilayer structure of three or more layers, the influence by film defects can be further reduced.

CONCLUSION

The active matrix substrate 1 according to aspect 1 of the present invention includes a first electrode (array electrode 13), a dielectric layer 16 covering the first electrode (array electrode 13), and a first water-repellent layer 18 in this order on a first substrate 11. The dielectric layer 16 includes a silicon nitride film located on the side in contact with the first water-repellent layer 18, and the silicon nitride film has a surface layer region 17 containing oxygen in the surface on the side in contact with the first water-repellent layer.

According to the above configuration, the driving voltage is reduced, and the adhesion between the dielectric layer and the water-repellent layer is excellent.

In the active matrix substrate 1 according to aspect 2 of the present invention, the dielectric layer 16 in the aspect 1 has a multilayer structure composed of two or more layers and may include a silicon nitride film, a silicon oxynitride film, or a silicon oxide film on the side in contact with the first electrode.

According to the above configuration, a leak defect can be further prevented from occurring.

In the active matrix substrate 1 according to aspect 3 of the present invention, the surface layer region 17 in the aspect 1 or 2 may be a region within a range of 10% of the thickness of the dielectric layer 16 in the depth direction from the surface on the side in contact with the first water-repellent layer 18.

According to the above configuration, the silicon nitride film can have both a high dielectric constant and high adhesion with the water-repellent layer.

In the active matrix substrate 1 according to aspect 4 of the present invention, the first water-repellent layer 18 in any one of the aspects 1 to 3 may be a layer containing a fluororesin having a functional group for adhesion with the silicon nitride film.

According to the above configuration, it is possible to form a water-repellent layer having excellent water repellency and excellent adhesion with the silicon nitride film.

The microfluidic device 10 according to aspect 5 of the present invention includes the active matrix substrate 1 according to any one of the aspects 1 to 4 and a counter substrate 2 including a second electrode 20 and a second water-repellent layer 19 in this order on a second substrate. The active matrix substrate 1 and the counter substrate 2 are bonded to each other with a gap therebetween via a sealing material such that the first water-repellent layer 18 and the second water-repellent layer 19 face each other.

According to the above configuration, it is possible to provide a microfluidic device having a reduced driving voltage and excellent adhesion between the dielectric layer and the water-repellent layer.

The method for manufacturing the active matrix substrate 1 according to aspect 6 of the present invention includes a step of forming a first electrode (array electrode 13) on a first substrate 11, a step of forming a dielectric layer 16 covering the first electrode (array electrode 13), and a step of forming a first water-repellent layer 18 on the dielectric layer 16. The step of forming a dielectric layer 16 includes a step of forming a silicon nitride film by a plasma chemical vapor deposition method and a step of oxidizing a surface of the silicon nitride film; and the step of forming a first water-repellent layer 18 includes a step of forming the first water-repellent layer 18 on the oxidized surface of the silicon nitride film.

According to the above configuration, the same effect as in the aspect 1 is obtained.

In the method for manufacturing an active matrix substrate 1 according to aspect 7 of the present invention, the step of forming a dielectric layer 16 in the aspect 6 may further include a step of forming a silicon nitride film, a silicon oxynitride film, or a silicon oxide film on the first electrode (array electrode 13), before the step of forming a silicon nitride film.

According to the above configuration, the same effect as in the aspect 2 is obtained.

The method for manufacturing an microfluidic device 10 according to aspect 8 of the present invention includes the steps included in the method for manufacturing an active matrix substrate 1 of the aspect 6 or 7; a step of forming a counter substrate 2 including a step of forming a second electrode 20 on a second substrate 15 and a step of forming a second water-repellent layer 19 on the second electrode 20; and a step of bonding the active matrix substrate 1 and the counter substrate 2 to each other with a gap therebetween via a sealing material such that the first water-repellent layer 18 and the second water-repellent layer 19 face each other.

According to the above configuration, the same effect as in the aspect 5 is obtained.

The embodiments of the present invention are not limited to the respective embodiments described above and can be variously modified within the scope shown in the claims, and embodiments obtained by appropriately combining technical means disclosed in different embodiments are also encompassed in the technical scope of the present invention. Furthermore, new technical features can be formed by combining the technical means disclosed in the respective embodiments.

REFERENCE SIGNS LIST 1 active matrix substrate
2 counter substrate
10 AM-EWOD device (microfluidic device)
11 first substrate
12 thin-film electronic circuit
13 array electrode (first electrode)
14 droplet
15 second substrate
16 dielectric layer
17 surface layer region
18 first water-repellent layer
19 second water-repellent layer
20 second electrode
100 glass substrate (first substrate)
101 buffer layer
102 semiconductor layer
103 gate insulating layer
104 gate electrode
105 interlayer insulating layer
106 contact hole
107 source electrode
108 drain electrode 109 interlayer insulating layer
110 array electrode (first electrode)
111 dielectric layer
112 first water-repellent layer
200 glass substrate (second substrate)
201 second electrode
202 second water-repellent layer
203 reagent inlet
204 sealing material
1000 AM-EWOD device (microfluidic device)
1001 first substrate
1002 thin-film electronic circuit
1003 array electrode (first electrode)
1004 lower dielectric layer
1005 upper dielectric layer
1006 surface layer region
1007 first water-repellent layer
1008 droplet
1009 second water-repellent layer
1010 second electrode
1011 second substrate
1100 active matrix substrate
1200 counter substrate

The invention claimed is:

1. An active matrix substrate comprising a first electrode, a dielectric layer covering the first electrode, and a first water-repellent layer in this order on a first substrate, wherein
the dielectric layer includes a silicon nitride film located on a side in contact with the first water-repellent layer; and
the silicon nitride film has a surface layer region containing oxygen in a surface on a side in contact with the first water-repellent layer.

2. The active matrix substrate according to claim 1, wherein the dielectric layer has a multilayer structure comprising two or more layers and includes a silicon nitride film, a silicon oxynitride film, or a silicon oxide film on a side in contact with the first electrode.

3. The active matrix substrate according to claim 1, wherein the surface layer region is a region within 10% of the thickness of the dielectric layer in a depth direction from the surface on the side in contact with the first water-repellent layer.

4. The active matrix substrate according to claim 1, wherein the first water-repellent layer is a layer containing a fluororesin having a functional group for adhesion with the silicon nitride film.

5. A microfluidic device comprising:
the active matrix substrate according to claim 1; and
a counter substrate including a second electrode and a second water-repellent layer in this order on a second substrate, wherein
the active matrix substrate and the counter substrate are bonded to each other with a gap therebetween via a sealing material such that the first water-repellent layer and the second water-repellent layer face each other.

6. A method for manufacturing an active matrix substrate comprising forming a first electrode on a first substrate, forming a dielectric layer covering the first electrode, and forming a first water-repellent layer on the dielectric layer, wherein
forming the dielectric layer includes forming a silicon nitride film by a plasma chemical vapor deposition method and oxidizing a surface of the silicon nitride film; and
forming the first water-repellent layer includes forming the first water-repellent layer on the oxidized surface of the silicon nitride film.

7. The manufacturing method according to claim 6, wherein forming a dielectric layer further includes forming a silicon nitride film, a silicon oxynitride film, or a silicon oxide film on the first electrode, before forming the silicon nitride film.

8. A method for manufacturing a microfluidic device, comprising:
the method for manufacturing an active matrix substrate according to claim 6;
forming a counter substrate including forming a second electrode on a second substrate and forming a second water-repellent layer on the second electrode; and
bonding the active matrix substrate and the counter substrate with a gap therebetween via a sealing material such that the first water-repellent layer and the second water-repellent layer face each other.

* * * * *